United States Patent
Kaneda et al.

(10) Patent No.: US 9,379,423 B2
(45) Date of Patent: Jun. 28, 2016

(54) CAVITY FILTER

(71) Applicant: Alcatel-Lucent USA Inc., Murray Hill, NJ (US)

(72) Inventors: Noriaki Kaneda, Westfield, NJ (US); Tsu-Wei Lin, Piscataway, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 92 days.

(21) Appl. No.: 14/278,887

(22) Filed: May 15, 2014

(65) Prior Publication Data

US 2015/0333386 A1 Nov. 19, 2015

(51) Int. Cl.
*H01P 1/202* (2006.01)
*H01P 7/04* (2006.01)
*H01P 1/208* (2006.01)
*H03J 7/16* (2006.01)

(52) U.S. Cl.
CPC . *H01P 1/208* (2013.01); *H03J 7/16* (2013.01); *H01P 1/202* (2013.01); *H01P 7/04* (2013.01)

(58) Field of Classification Search
CPC .......... H01P 1/2053; H01P 1/202; H01P 7/04
USPC ................ 333/206, 207, 222, 223, 202, 99 S, 333/219.1; 334/58, 78–84
See application file for complete search history.

(56) References Cited

U.S. PATENT DOCUMENTS

| | | | |
|---|---|---|---|
| 4,873,501 A * | 10/1989 | Hislop | H01P 1/2039 333/204 |
| 7,250,833 B2 * | 7/2007 | Eddy | H01P 1/30 333/202 |
| 7,777,598 B2 | 8/2010 | Salehi et al. | |
| 2002/0050872 A1 * | 5/2002 | Terashima | H01P 1/203 333/99 S |
| 2009/0280991 A1 * | 11/2009 | Yamanaka | H01P 7/10 505/210 |
| 2010/0253449 A1 * | 10/2010 | Rofougaran | H01L 23/5227 333/166 |

OTHER PUBLICATIONS

EngineersHandbook.com, "Plastic Thermal Expansion Coefficients", 2004, Engineer's Handbook.*

* cited by examiner

*Primary Examiner* — Robert Pascal
*Assistant Examiner* — Gerald Stevens
(74) *Attorney, Agent, or Firm* — Harness, Dickey & Pierce, P.L.C.

(57) ABSTRACT

In one embodiment, the cavity filter includes a housing defining a cavity, and at least one post projecting from a first interior surface of the housing towards a second interior surface of the housing. The first interior surface faces the second interior surface. The cavity filter further includes a thermo electric cooler disposed on the housing. The thermo electric cooler is configured to one of cool and heat at least a portion of the housing.

23 Claims, 6 Drawing Sheets

CAVITY FILTER

BACKGROUND

A cavity resonator is a hollow conductive block where an electromagnetic standing wave can be supported. Cavity filters use the principle of a cavity resonator to filter out undesired frequency components and obtain desired frequency components. Cavity filters are often low loss and highly linear that they are often used for pre-select filters in wireless base stations and remote radio heads.

One of the conventional approaches for a compact cavity filter is to use an evanescent mode cavity resonator. The evanescent cavity resonator, which is sometimes called a transverse electromagnetic mode (TEM) cavity filter, achieves smaller than wavelength resonance for a given cavity size by introducing a strongly capacitive element within the cavity resonator, such as a metal post/disk close to one of the metal walls of the cavity. Unfortunately, such compact cavity filters are sensitive to changes in temperature as temperature changes cause the dimensions of the cavity filter to change by thermal expansion or contraction. This affects the frequency characteristics of the cavity filter. One of the current approaches to cavity filter design involve using materials with small thermal coefficients of expansion so that the constructed filter dimensions are relatively insensitive to changes in temperature.

SUMMARY

At least one embodiment relates to a cavity filter.

In one embodiment, the cavity filter includes a housing defining a cavity, and at least one post projecting from a first interior surface of the housing towards a second interior surface of the housing. The first interior surface faces the second interior surface. The cavity filter further includes a thermo electric cooler disposed on the housing. The thermo electric cooler is configured to one of cool and heat at least a portion of the housing.

In one embodiment, the thermo electric cooler is disposed on an exterior surface of the housing. For example, the thermo electric cooler may be aligned with the post.

In one embodiment, a controller is configured to control the thermo electric cooler. For example, the controller may be configured to control the thermo electric cooler to one of expand and contract at least a portion of the housing and maintain a frequency characteristic of the cavity filter. In another embodiment, the cavity filter includes a temperature sensor, and the controller is configured to control the thermo electric cooler based on output of the temperature sensor.

In one embodiment, the housing includes a bottom, at least one side wall and a cover. The post projects from the bottom towards the cover, and the thermo electric cooler is disposed on the cover. For example, the bottom may include a base having a first surface and an opposite second surface. The first surface may be plated in a first conductive material, at least a portion of the first surface is an interior surface of the housing, the bottom may include first and second apertures, a first conductive strip is formed on the second surface and across the first aperture, and a second conductive strip is formed on the second surface and across the second aperture. In one embodiment, the base is printed circuit board, the first conductive material is copper, the first conductive strip is formed of copper and the second conductive strip is formed of copper. In one embodiment, the bottom, the cover and the side wall include printed circuit board.

In one embodiment, a first gap material fills the gap between the cover and the side wall, and the first gap material is electrically and thermally conductive.

In one embodiment, a second gap material fills the gap between the cover and the post, and the second gap material is an insulator.

In one embodiment, the post includes one of a metal and a dielectric.

In one embodiment, at least a portion of the housing on which the thermo electric cooler is disposed includes a first material, and the post includes a second material, where the second material has a lower coefficient of thermal expansion than the first material. For example, the first material has a coefficient of thermal example greater than 100, and the second material has a coefficient of thermal expansion less than 30.

At least one embodiment relates to a method associated with a cavity filter.

In one embodiment, the method includes sensing a condition associated with a cavity filter; obtaining, by a processor, a control parameter value based on the sensed condition; and controlling a thermo electric cooler disposed on the cavity filter based on the obtained control parameter value.

In one embodiment, the sensed condition is ambient temperature.

In one embodiment, the sensed condition is a power level of a desired frequency at an output of the cavity filter.

In one embodiment, the obtaining includes accessing a look up table stored in a memory based on the sensed condition, the look up table mapping possible sensed conditions to control parameter values.

In another embodiment, the method includes changing a temperature of a material forming at least a portion of a cavity filter to control at least one dimension of the cavity filter.

In one embodiment, the changing changes the temperature using a thermo electric cooler such that the dimension is stabilized over temperature.

In one embodiment, the changing changes the temperature using a thermo electric cooler such that the dimension is controlled to tune an operating frequency of the cavity filter.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of example embodiments.

DETAILED DESCRIPTION OF EXAMPLE EMBODIMENTS

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. This invention may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

Figure 1:
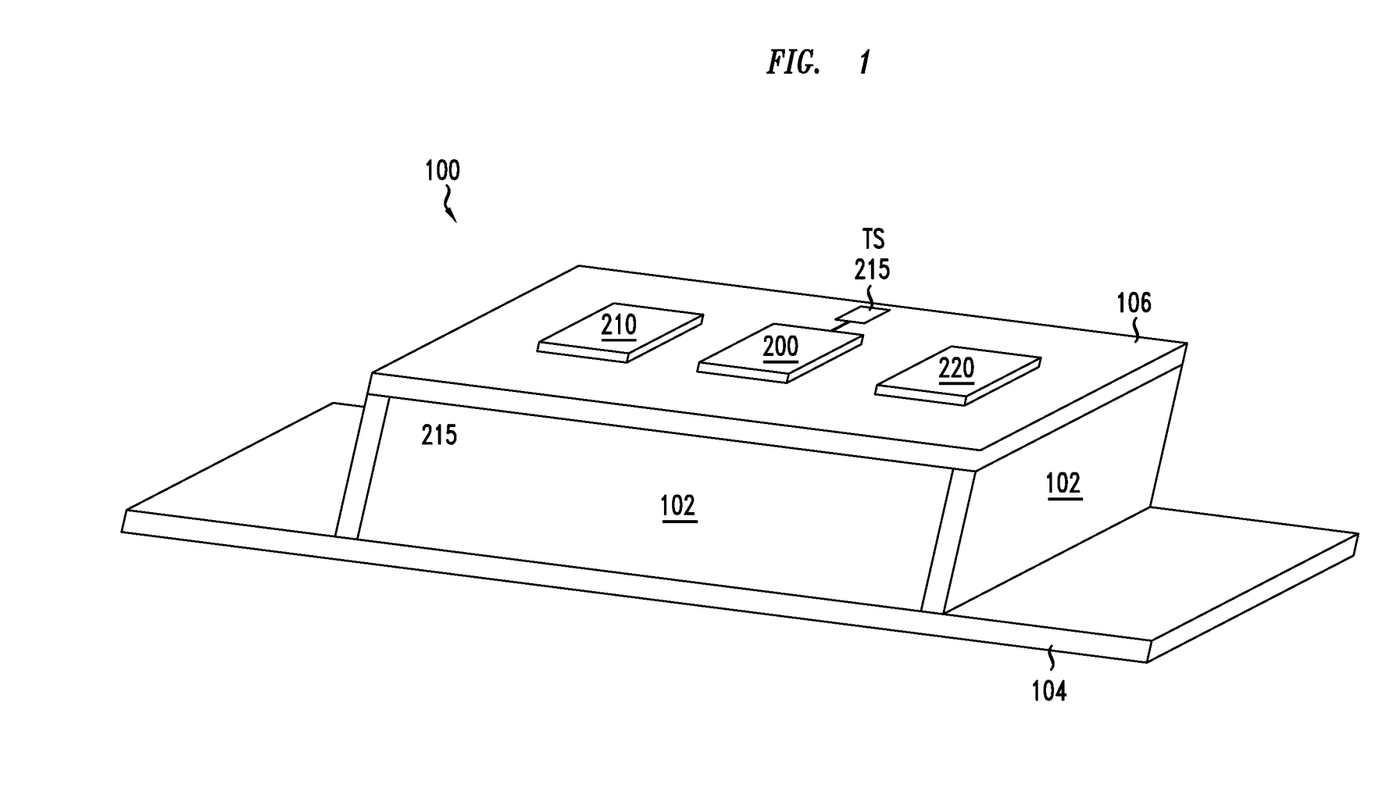
FIG. 1 illustrates a top perspective view of a cavity filter according to an example embodiment.
Figure 2:
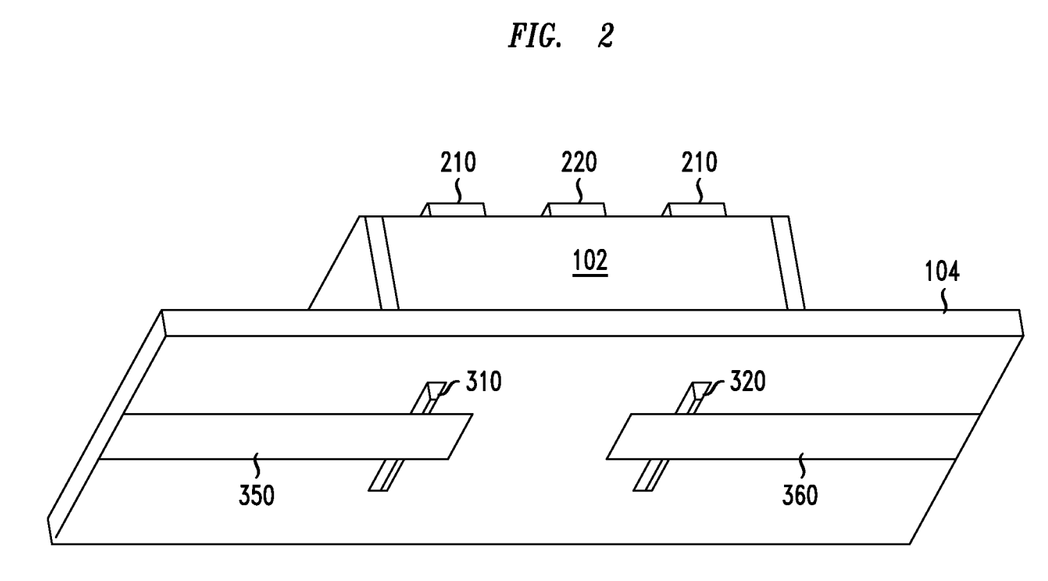
FIG. 2 illustrates a bottom perspective view of the cavity filter.
Figure 3:
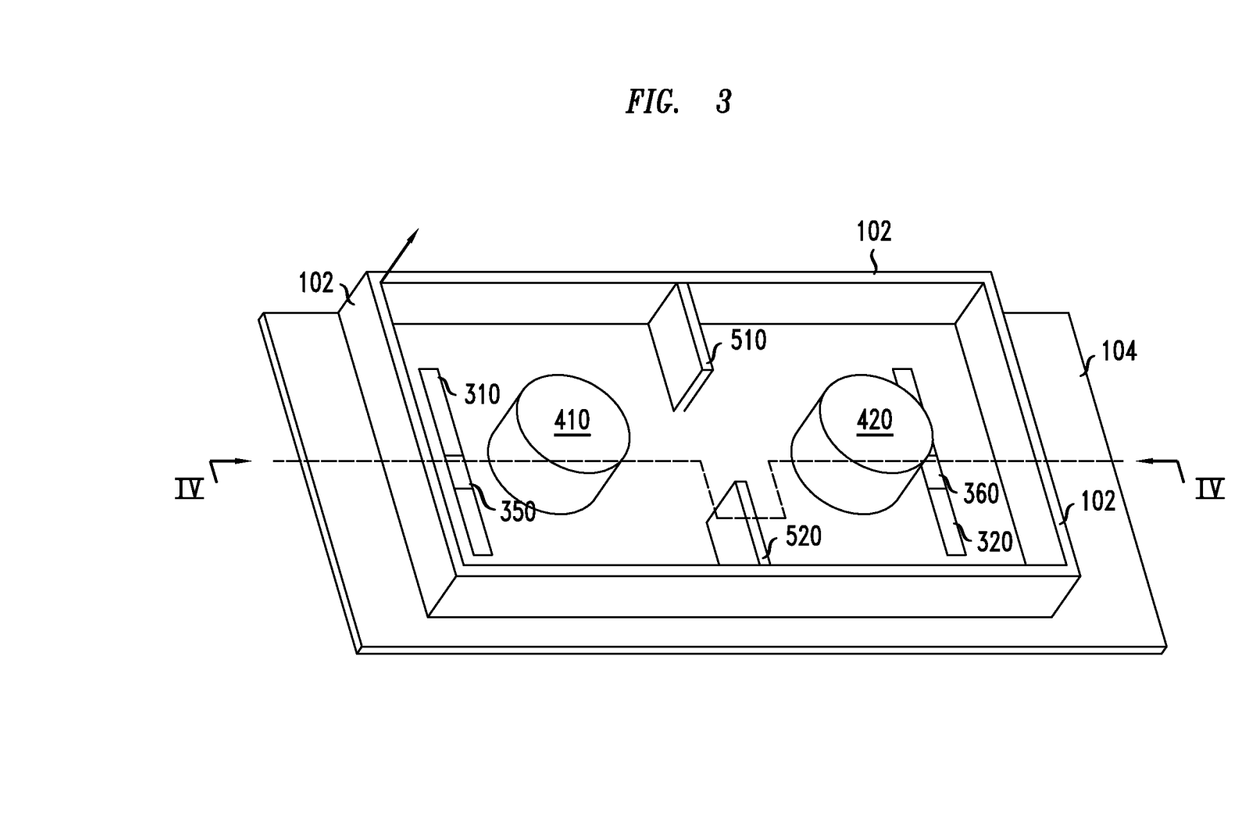
FIG. 3 illustrates a top perspective view of the cavity filter with the cover removed.

FIG. 1 illustrates a top perspective view of a cavity filter according to an example embodiment, FIG. 2 illustrates a bottom perspective view of the cavity filter, and FIG. 3 illustrates a top perspective view of the cavity filter with the cover removed. As shown, the cavity filter includes a housing 100 that defines a rectangular parallelepiped cavity or space within the interior of the housing 100. However, it will be understood that the housing 100 may be configured or structured to define spaces of other shapes such as cylindrical. In this embodiment, the housing 100 includes multiple materials that have different rates of expansion over temperatures; for example, copper and fluorinated ethylene propylene (FEP). having coefficients of thermal expansion of 16.6 and 120 [ppm/K], respectively.

The housing 100 has six sides: four side walls 102, a bottom 104 and a cover or top 106. The structure of the side walls 102, bottom 104 and cover 106 may be a base material (e.g., polytetrafluoroethylene PTFE, printed circuit board PCB, etc.) with at least the inner surface plated with copper. This will be described in greater detail below with respect to FIG. 4; however, it will be understood that the example embodiments are not limited to these structures.

FIG. 1 shows that first and second thermo-electric coolers (TECs) 210 and 220 and a controller 200 are disposed on the cover 106. TECs are well-known devices that use the Peltier effect to create a heat flux between two different types of materials and cause a cooling or heating effect. Accordingly, TECs 210 and 220 will not be described in detail. The controller 200 is coupled to the TECs 210 and 220, and controls the cooling/heating operations of the TECs 210 and 220. FIG. 1 shows the controller 200 connected to a temperature sensor 215, and in one embodiment the controller 200 controls the operation of the TECs 210 and 220 based on output from the temperature sensor 215. While FIG. 1 illustrates one temperature sensor, it will be understood that multiple temperature sensors, for example, placed near TECs 210 and 220 may be used. The operation of the controller 200 and TECs 210 and 220 will be described in detail below.

FIG. 2 shows that the bottom 104 includes first and second rectangular apertures 310 and 320. A first conductive strip 350 extends across aperture 310, and a second conductive strip 360 extends across aperture 320. In one embodiment, the first and second conductive strips 350 and 360 serve as input and output signal ports, respectively, for the cavity filter and extend to respective ends of the bottom 104. The first and second conductive strips 350 and 360 may be copper. For example, the bottom 104 may be a PCB with the first and second conductive strips 350 and 360 patterned on a bottom surface thereof, and the top surface of the PCB may be plated by a conductive material (e.g., copper). While the figures show the bottom 104 extending beyond the side walls 102, the periphery of the bottom 104 may match the periphery defined by the side walls 102.

FIG. 3 shows that first and second posts 410 and 420 are disposed to project up from the interior surface of the bottom 102 towards the interior surface of the cover 106. The first and second posts 410 and 420 may have a core and a cladding. The core may include a metal or metal containing material having a small coefficient of thermal expansion such as copper 16.6, aluminium 22.2, etc. The cladding covering the core may include a dielectric with copper plating over the dielectric or maybe copper plating only.

As further shown in FIG. 3, first and second interior walls 510 and 520 project perpendicularly from the oppositely facing side walls 102 running the length of the of the cavity filter. The first and second interior walls 510 and 520 may bisect the oppositely facing side walls 102, and divide the cavity into two respective spaces, each associated with one of the first and second posts 410 and 420. The amount that the first and second interior wall 510 and 520 project into the cavity is a matter of design choice that may be determined through empirical study based on the desired frequency characteristics of the cavity filter.

Figure 4:
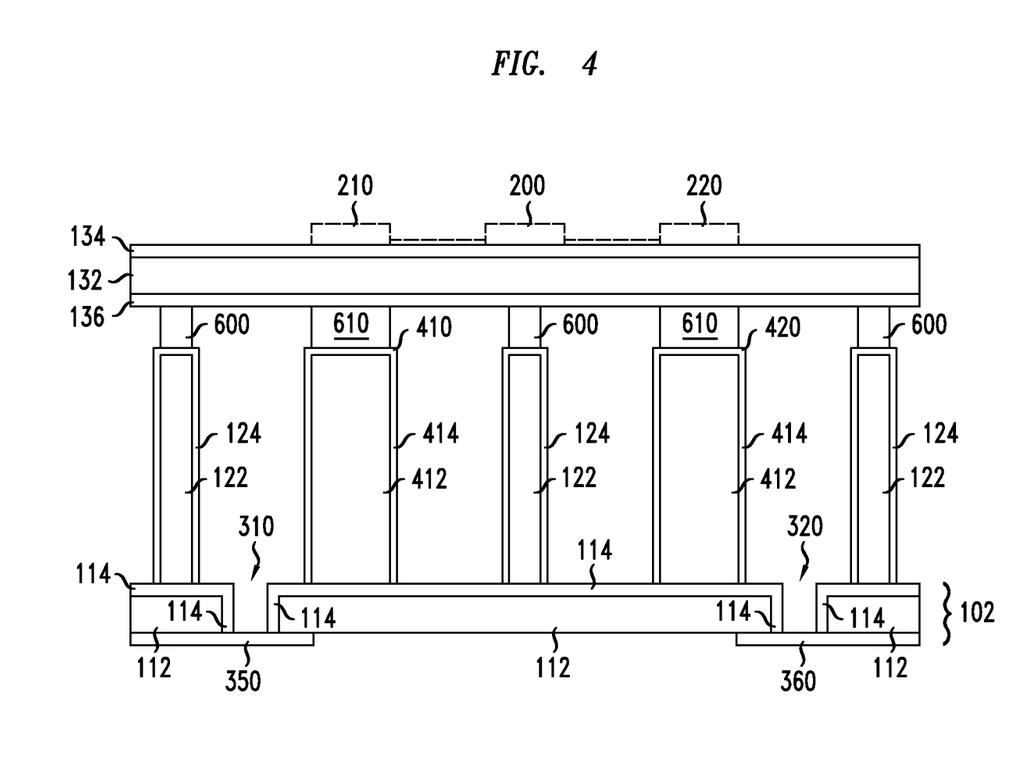
FIG. 4 illustrates a cross-section of the cavity filter along the line IV-IV in FIG. 3.

FIG. 4 illustrates a cross-section of the cavity filter along the line IV-IV in FIG. 3. As shown, the bottom 102 includes a first PCB 112. An upper surface of the first PCB 112 is copper plated forming copper layer 114. The apertures 310 and 320 have interior surfaces plated with copper as well, and thus forming part of the copper layer 114. Alternatively, the apertures 310 and 320 may be filled with a conducting material. In either way, the first and second conductive strips 350 and 360 are electrically connected to the copper layer 114. As will be described in details below, the first conductive strip 350 may serve as the input, the second conductive strip 360 may serve as the output, and the copper layer 114 may form the ground plane of the cavity filter.

The side walls 102 maybe second PCB 122 plated in copper 124. The first and second posts 410 and 420 may have a core 412 and a cladding 414. The core 412 may include a metal or metal containing material having a small coefficient of thermal expansion such as discussed above with respect to FIG. 3. The cladding 414 covering the core 412 may include a dielectric covered in copper plating or copper plating only.

The top 106 may include a third PCB 132. The third PCB 132 may have an upper surface plated in copper to form copper layer 134, and may have a bottom surface plated in copper to form copper layer 136. The material of PCB 132 should have a different thermal expansion coefficient from the core 412 such that the PCB 132 and the core 412 expand at different rates when the temperature changes. The material of PCB 132 can be PTFE with a thermal expansion coefficient [ppm/K] of 135, which is about 8 times larger than the thermal expansion coefficient of copper at 16.6. A first gap material 600 is disposed on the side walls 102 and the interior walls 510 and 520 to fill the gaps between (1) the cover 106 and (2) the side walls 102 and the interior walls 510 and 520. The first gap material 600 may be copper and/or solder so that the cover 106 is electrically and thermally connected to the side walls 102 and the interior walls 510 and 520.

A second gap material 610 may also be disposed on the first and second posts 410 and 420 to fill the gaps between the cover 106 and the first and second posts 410 and 420. In one embodiment, the second gap material is an insulator. For example, the second gap material may be an insulator having a permittivity similar to air such as fluorinated ethylene propylene (FEP).

While not necessarily lying along the cross-section line IV-IV, controller 200 and TECs 210 and 220 have been shown in FIG. 4 by dashed lines for the sake of completeness. Namely, the TECs 210 and 220 are shown respectively aligned with posts 410 and 420 (e.g., lie along the longitudinal axis of the posts). Stated another way, the posts 410 and 420 project toward the TECs 210 and 220, respectively. However, while the TECs 210 and 220 are shown aligned with the posts 410 and 420, respectively, it will be appreciated that the example embodiments are not limited to this. Instead, the TECs 210 and 220 may be positioned elsewhere on the cover 106 or elsewhere on the housing.

Figure 5:
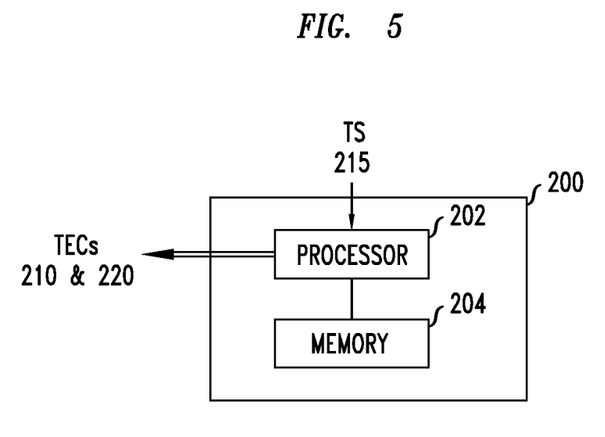
FIG. 5 illustrates an embodiment of the controller in FIG. 1.

Next, operation of the cavity filter will be described with reference to FIGS. 1-4, FIG. 5 and FIG. 6. FIG. 5 illustrates an embodiment of the controller 200. The controller 200 may include a processor 202, and a memory 204. The processor 202 may be configured to carry out instructions of a computer program by performing the arithmetical, logical, and input/output operations. While not shown, the processor 202 may have low-speed analog-to-digital converters to read values from temperature sensors and/or digital-to-analog converters to set the proper voltage to TECs 210 and 210. The processor 202 may read the stored data or instructions from the memory 204. The instructions, when executed by the processor 202, configure the processor 202 to perform methods associated with the example embodiments such as will be described below with respect to FIG. 6. The stored data may contain the voltage settings for the TECs 210 and 220 per particular values read at the temperature sensor(s) 215.

The memory 204 may be a computer readable storage medium. The memory 204 may include a random access memory (RAM) and/or read only memory (ROM), and may be a flash memory, for example. The processor 202 may be a logic chip, for example, a central processing unit (CPU), a controller, or an application-specific integrated circuit (ASIC), that when, executing the instructions stored in the memory 204, is configured as a special purpose machine.

Figure 6:
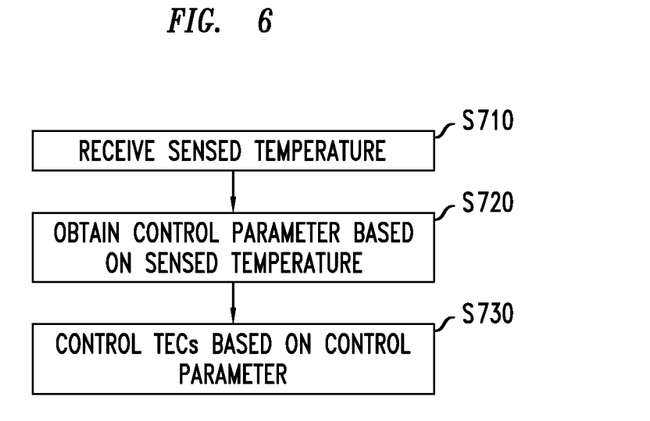
FIG. 6 illustrates a flow chart of a method for controlling the thermo electric coolers in FIG. 1 according to an example embodiment.

FIG. 6 illustrates a flow chart of a method for controlling the thermo electric coolers in FIG. 1 according to an example embodiment. As shown, the processor 202 receives an ambient temperature sensed by the temperature sensor 215 in step S710. The processor 202 uses the sensed temperature to access a look-up table stored in the memory 204, and obtain a control parameter in step S720. The look-up table maps sensed temperatures to control parameter values. In step S730, the processor 202 controls the TECs 210 and 220 based on the control parameter value. For example, the control parameter may be a voltage, current, and/or etc. to apply to the TECs 210 and 220.

The TECs 210 and 220 will perform a cooling function based the control signal from the processor 202. For example, TECs 210 and 220 may increase cooling, decrease cooling or leave the amount of cooling unchanged in response to the controls signal. In this manner, the TECs 210 and 220 cool and/or heat the cavity filter, and in particular locally cool and/or heat the portion of the cover 106 over the first and second posts 410 and 420. As will be appreciated, the metal (e.g., copper) plating the cover 106, side walls 102, interior walls 510 and 520 and bottom 104 and metal core 412 have a small coefficient of thermal expansion (e.g., less than 30), while the PCB 132 and the gap material 610 have a large coefficient of thermal expansion (e.g., greater than 100). As a result of cooling and heating the cavity filter and the difference in thermal expansion coefficients between the various materials, the controller 200 can control the distance between the cover 106 and the first and second posts 410 and 420. As will be appreciated, this will change the frequency characteristic (e.g., resonant frequency) of the cavity filter.

Accordingly, the cavity filter may be controlled to reduce or eliminate negative temperature affects. Namely, as the ambient temperature changes, the controller 200 may dynamically control the cavity filter to maintain a substantially constant resonant frequency. Here, the look up table may be empirically constructed based on the range of ambient temperatures in which the cavity filter is expected to operate.

Still further, the cavity filter may be controlled to change the resonant frequency. Namely, the controller 200 may be configured to receive input indicating a desired resonant frequency. The memory 204 may store different look-up tables for each possible desired resonant frequency. The processor 202 would use the look-up table associated with the received, desired resonant frequency.

As will be appreciated, the various dimensions of the elements forming the cavity filter will also depend on the desired frequency characteristics of the cavity filter, and these dimensions may be determined through empirical study.

Furthermore, instead of controlling the distance between the cover and the posts, other dimensions of the cavity filter may be controlled through use and position of the TECs.

In the example embodiments, copper was disclosed as an example metal having a small coefficient of thermal expansion to permit control over dimensions of the cavity filter through cooling and/or heating. However, the example embodiments are not limited to use of copper. Instead, any metal having a coefficient of thermal expansion smaller than 30 or so may be used.

In the example embodiments, PCB was disclosed as an example material having a large coefficient of thermal expansion to permit control over dimensions of the cavity filter through cooling and/or heating. However, the example embodiments are not limited to the use of PCB. Instead, any material having a coefficient of thermal expansion greater than 100 or so may be used.

As will be appreciated, control of the TECs is not limited to control based on sensed ambient temperature. Instead, control may be based on any number or combination of environmental or operating characteristics associated with the cavity filter. For example, a coupler may be used to obtain a portion of the output from the cavity filter. The coupled signal may be supplied to the processor 202. The processor 202 may determine the power level of a particular frequency, and control the TECs 210 and 220 based on changes in the power level.

While the example embodiment was described as a cavity filter having two posts (e.g., first and second posts 410 and 420), the example embodiments are not limited to a two post cavity filter. Instead, the cavity filter could have a single post, or more than two posts. For example, if a single post is used, then only a single TEC may be used, and the interior walls 510 and 520 become unnecessary. By contrast if more than two posts are used, additional TECs may be used and additional interior walls may be used to define spaces within the cavity associated with each post.

Also the example embodiment was described as having microstrip feeding networks 350, 360, but the example embodiments are not limited to these types of inputs/outputs. Instead, for example, coaxial feeding networks may be used. The coaxial feeding networks typically achieve lower electric insertion loss.

Variations of the example embodiments are not to be regarded as a departure from the spirit and scope of the example embodiments. All such variations as would be apparent to one skilled in the art are intended to be included within the scope of this disclosure.

What is claimed is:

1. A cavity filter, comprising:
a housing defining a cavity, the housing including a bottom, at least one side wall and a cover, the bottom including a base having a first surface and an opposite second surface, the first surface being plated in a first conductive material, at least a portion of the first surface being a first interior surface of the housing, the bottom including first and second apertures, a first conductive strip being formed on the second surface and across the first aperture, a second conductive strip being formed on the second surface and across the second aperture;
at least one post projecting from the first interior surface of the housing towards a second interior surface of the housing, the first interior surface facing the second interior surface; and
a thermo electric cooler disposed on the housing, the thermo electric cooler configured to one of cool and heat at least a portion of the housing.

2. The cavity filter of claim 1, wherein the thermo electric cooler is disposed on an exterior surface of the housing.

3. The cavity filter of claim 2, wherein the thermo electric cooler is aligned with the at least one post.

4. The cavity filter of claim 1, further comprising:
a controller configured to control the thermo electric cooler.

5. The cavity filter of claim 4, wherein the controller is configured to control the thermo electric cooler to one of expand and contract at least a portion of the housing and maintain a frequency characteristic of the cavity filter.

6. The cavity filter of claim 4, further comprising:
a temperature sensor; and wherein
the controller is configured to control the thermo electric cooler based on an output of the temperature sensor.

7. The cavity filter of claim 1, wherein
the at least one post projects from the bottom towards the cover; and
the thermo electric cooler is disposed on the cover.

8. The cavity filter of claim 1, wherein the base is a printed circuit board, the first conductive material is copper, the first conductive strip is formed of copper and the second conductive strip is formed of copper.

9. The cavity filter of claim 1, wherein the bottom, the cover and the side wall include at least one printed circuit board.

10. The cavity filter of claim 1, wherein a first gap material fills a gap between the cover and the at least one side wall, the first gap material being electrically and thermally conductive.

11. The cavity filter of claim 10, wherein a second gap material fills a gap between the cover and the at least one post, and the second gap material is an insulator.

12. The cavity filter of claim 1, wherein a gap material fills a gap between the at least one post and the second interior surface, and the gap material is an insulator.

13. The cavity filter of claim 1, wherein the housing includes at least one printed circuit board.

14. The cavity filter of claim 13, wherein the at least one post includes one of a metal and a dielectric.

15. The cavity filter of claim 1, wherein
at least a portion of the housing on which the thermo electric cooler is disposed includes a first material; and
the at least one post includes a second material, and the second material has a lower coefficient of thermal expansion than the first material.

16. The cavity filter of claim 15, wherein the first material has a coefficient of thermal expansion greater than 100, and the second material has a coefficient of thermal expansion less than 30.

17. A method, comprising:
sensing a condition associated with a cavity filter, the cavity filter including a housing defining a cavity, the housing including a bottom, at least one side wall and a cover, the bottom including a base having a first surface and an opposite second surface, the first surface being plated in a first conductive material, at least a portion of the first surface being an interior surface of the housing, the bottom including first and second apertures, a first conductive strip being formed on the second surface and across the first aperture, a second conductive strip being formed on the second surface and across the second aperture;
obtaining, by a processor, a control parameter value based on the sensed condition; and controlling a thermo electric cooler disposed on the cavity filter based on the obtained control parameter value.

18. The method of claim 17, wherein the sensed condition is ambient temperature.

19. The method of claim 17, wherein the sensed condition is a power level of a desired frequency at an output of the cavity filter.

20. The method of claim 17, wherein the obtaining comprises:
accessing a look up table stored in a memory based on the sensed condition, the look up table mapping possible sensed conditions to control parameter values.

21. A method, comprising:
changing a temperature of a material forming at least a portion of a cavity filter to control at least one dimension of the cavity filter;
wherein the cavity filter includes a housing defining a cavity, the housing including a bottom, at least one side wall and a cover, the bottom including a base having a first surface and an opposite second surface, the first surface being plated in a first conductive material, at least a portion of the first surface being an interior surface of the housing, the bottom including first and second apertures, a first conductive strip being formed on the second surface and across the first aperture, a second conductive strip being formed on the second surface and across the second aperture.

22. The method of claim 21, wherein the changing changes the temperature using a thermo electric cooler such that the dimension is stabilized over a range of ambient temperatures.

23. The method of claim 21, wherein the changing changes the temperature using a thermo electric cooler such that the dimension is controlled to tune an operating frequency of the cavity filter.

* * * * *